(12) United States Patent
Wisniewski et al.

(10) Patent No.: US 9,869,705 B2
(45) Date of Patent: Jan. 16, 2018

(54) MAGNETOMETER SAMPLING TO DETERMINE AN ELECTRIC POWER PARAMETER

(71) Applicant: Vectorform, LLC, Royal Oak, MI (US)

(72) Inventors: Joseph S. Wisniewski, Livonia, MI (US); Matthew Tilchen, Royal Oak, MI (US)

(73) Assignee: Insight Energy Ventures LLC, Royal Oak, MI (US)

(*) Notice: Subject to any disclaimer, the term of this patent is extended or adjusted under 35 U.S.C. 154(b) by 750 days.

(21) Appl. No.: 14/201,041

(22) Filed: Mar. 7, 2014

(65) Prior Publication Data

US 2014/0266177 A1    Sep. 18, 2014

Related U.S. Application Data

(60) Provisional application No. 61/792,671, filed on Mar. 15, 2013.

(51) Int. Cl.
| | |
|---|---|
| *G01R 23/00* | (2006.01) |
| *G01R 21/08* | (2006.01) |
| *G01R 33/02* | (2006.01) |
| *G01R 33/00* | (2006.01) |

(52) U.S. Cl.
CPC ......... *G01R 21/08* (2013.01); *G01R 33/0029* (2013.01); *G01R 33/0206* (2013.01)

(58) Field of Classification Search
CPC .............................. G01R 29/08; G01R 15/148
See application file for complete search history.

(56) References Cited

U.S. PATENT DOCUMENTS

| | | | | |
|---|---|---|---|---|
| 8,447,541 | B2* | 5/2013 | Rada et al. ............... | G05F 1/70 62/130 |
| 8,862,428 | B2* | 10/2014 | Lill .................... | G05B 19/0428 340/539.11 |
| 2012/0072143 | A1* | 3/2012 | Yogeeswaran ....... | G01R 15/207 702/61 |
| 2012/0290230 | A1* | 11/2012 | Berges Gonzalez ... | G01D 4/004 702/61 |
| 2013/0229173 | A1* | 9/2013 | Bertrand .............. | G01R 15/207 324/202 |

\* cited by examiner

*Primary Examiner* — Matthew G Marini
(74) *Attorney, Agent, or Firm* — Quinn IP Law (57) ABSTRACT

A method of analyzing an alternating electrical current includes polling a magnetometer at a constant sampling frequency to generate a plurality of magnetic field strength readings. The polling occurs over a plurality of cycles of the alternating electrical current. A time stamp is then assigned to each of the plurality of magnetic field strength readings, and the readings are saved within a common circular buffer according to each reading's respective time stamp and the fundamental frequency of the electrical current. A processor may then determine one or more harmonics of the magnetic field by analyzing the common circular buffer using a Fourier transform.

10 Claims, 4 Drawing Sheets

MAGNETOMETER SAMPLING TO DETERMINE AN ELECTRIC POWER PARAMETER

CROSS REFERENCE TO RELATED APPLICATIONS

This application claims the benefit of U.S. Provisional Application No. 61/792,671, filed Mar. 15, 2013, which is hereby incorporated by reference in its entirety.

TECHNICAL FIELD

The present invention relates to a sampling method for sampling a magnetometer in a portable digital power analyzer.

BACKGROUND

Many systems exist to provide a user with the ability to monitor the power consumption of an entire dwelling or small business. These systems include "smart" electrical meters that are installed by utility companies, or systems that attach to a building's power distribution panel to provide detailed, minute by minute analytics. While this can be a useful tool to analyze electrical consumption, they are also very costly and require specially trained technicians to install. Additionally, such systems are not capable of identifying specific devices that may be contributing to a household's power use. Instead, this may require individual measurement of each device within the house.

Individual device measurement has historically required either an intermediate measuring device that is placed (electrically) between the appliance and the wall outlet, or a current clamp that encircles a single conductor. The drawback to an intermediate device, is that the appliance must be separately plugged into the analyzer for testing. This creates an inconvenience for testing multiple devices, or a significant investment in hardware. Current clamps are impractical for residential use, as most residential electrical wiring includes multiple conductors that are bound together in a single cord. Additionally, meters that may utilize the current clamp readings are often expensive.

SUMMARY

A method of analyzing an alternating electrical current includes polling a magnetometer at a constant sampling frequency to generate a plurality of magnetic field strength readings. The polling occurs over a plurality of cycles of the alternating electrical current. A time stamp is then assigned to each of the plurality of magnetic field strength readings, and the readings are saved within a common circular buffer according to each reading's respective time stamp and the fundamental frequency of the electrical current. A processor may determine one or more harmonics of the magnetic field by analyzing the common circular buffer using a Fourier transform.

The present sampling technique may be beneficial when the sampling frequency is slower than the fundamental frequency. For example, the sampling frequency may be between 50 Hz and 59 Hz. In one configuration, the sampling frequency is slower than a Nyquist frequency for a harmonic frequency that is desired to be detected.

The above-mentioned sampling method may be performed, for example, by a device that includes a magnetometer, a wireless radio, a display, and a processor. Such devices may include cellular telephones, tablet computers, laptop computers, etc. The device may be configured by software to determine an electrical power parameter of an adjacent electrical wire having an alternating electrical current with a constant fundamental frequency.

The magnetometer is configured to monitor a magnetic field and provide an output indicative of magnetic field strength upon request. The processor may be in communication with the wireless radio, the magnetometer, and the display, and configured to poll the magnetometer at a constant sampling frequency to generate a plurality of magnetic field strength readings. The polling occurs over a plurality of cycles of the alternating electrical current.

The processor may assign a time stamp to each of the plurality of magnetic field strength readings, and save each of the plurality of magnetic field strength readings within a common circular buffer according to its respective time stamp and the fundamental frequency of the electrical current. The processor may then determine one or more harmonics of the magnetic field by analyzing the common circular buffer using a Fourier transform, and display an electrical power parameter via the display. The electrical power parameter is based on the one or more determined harmonics of the magnetic field.

The above features and advantages and other features and advantages of the present invention are readily apparent from the following detailed description of the best modes for carrying out the invention when taken in connection with the accompanying drawings.

DETAILED DESCRIPTION

Figure 1:
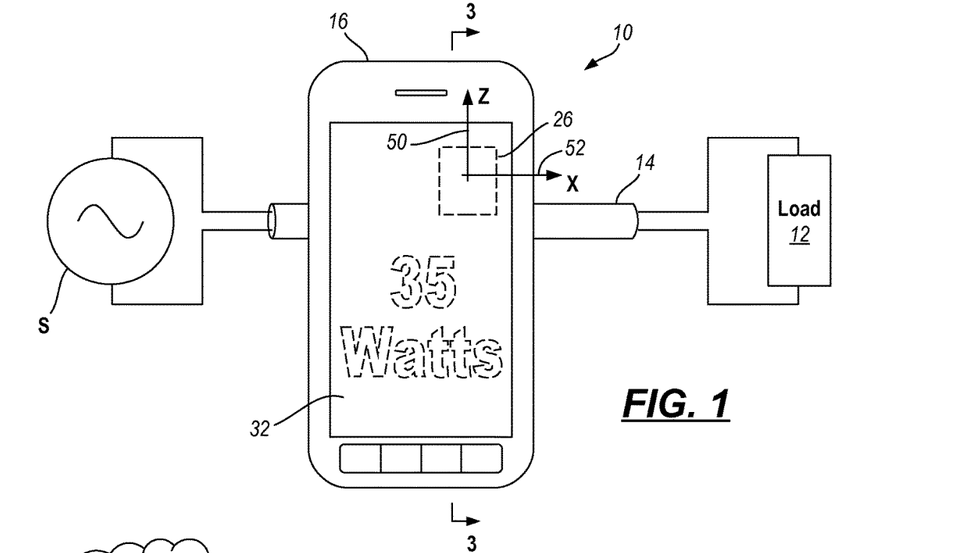
FIG. 1 is a schematic diagram of a portable digital computing device adjacent an electrical wire that connects a power source with a load.

Referring to the drawings, wherein like reference numerals are used to identify like or identical components in the various views, FIG. 1 schematically illustrates a portable computing device 10 that may be used to provide an estimate of various electrical usage characteristics of a load 12, by monitoring an electrical supply wire 14 that couples the load 12 with a source S.

An understanding of the characteristics of the current/power being consumed by the load 12 (i.e., through the wire 14), may allow a user to better understand their power consumption habits and alter behaviors where desired. The load 12 mentioned above may be any electrically operated device that is supplied with electrical power via a wire 14. Examples of such devices/loads 12 include televisions, refrigerators, microwaves, fans, lights, desktop computers, portable equipment charging devices, window air conditioners, stereo systems, commercial equipment, and/or industrial equipment. The methods described herein are explained with reference to single-phase alternating current (AC) electricity, however, the methods may be similarly applicable to three-phase AC systems, and direct current (DC) systems.

In one configuration, the portable computing device 10 may be a "smart phone"-style cellular telephone 16 ("smart phone 16"). As used herein, a smart phone 16 is a cellular telephone that permits a user to download and execute ancillary software and/or internet-based functionality in addition to placing and receiving telephone calls. As will be described below, the smart phone 16 may be specially configured to monitor an AC electrical wave in a wire 14 adjacent to the phone 16, using only circuitry within the phone 16. While the present description is made with respect to a smart phone 16, in other configurations, the portable computing device 10 may resemble a tablet computer, a slate computer, a laptop computer, a personal digital assistant (PDA), a digital "smart watch"-style wrist watch, or other similar styles of general purpose portable computers.

Figure 2:
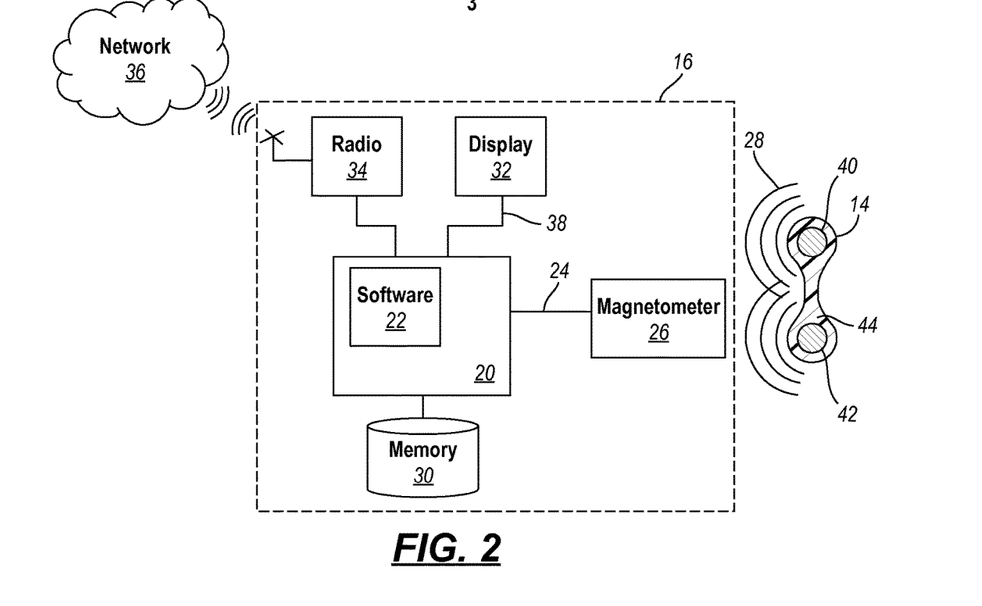
FIG. 2 is a schematic diagram of a smart phone-style portable digital computing device adjacent to a electrical wire.

Referring to FIG. 2, the smart phone 16 may include a processor 20 that is configured to execute specialized power detection software 22 to determine one or more power parameters of the adjacent electrical wire 14 and the load 12 coupled thereto. The power parameters may be determined using specialized algorithms defined by the software 22, together with magnetic field observations provided by a magnetometer 26 within the smart phone 16. Examples of power parameters that may be calculated include, but are not limited to, current flow, real power flow, apparent power flow, a power factor, electrical line harmonics, harmonic distortion and/or phasor relationships.

The included magnetometer 26 may be configured to monitor the strength of a magnetic field 28 surrounding the phone 16 in three-axes, and may provide a suitable indication of the strength of the field 28 to the processor 20 via an output 24. In one configuration, the processor 20 may additionally include one or more mapping applications (not shown) that are configured to use the magnetometer 26 as a compass for determining an orientation of the phone 16 relative to a global magnetic-north.

In addition to the processor 20 and magnetometer 26, the smart phone 16 may include non-volatile memory 30 and a display device 32, both in communication with the processor 20, as well as a wireless radio 34 that may permit two-way radio communication between the phone 16 and a network 36 (e.g. the internet or a cellular telephone network).

The processor 20 may be embodied as one or more distinct data processing devices, each having one or more microcontrollers or central processing units (CPU), read only memory (ROM), random access memory (RAM), electrically-erasable programmable read only memory (EEPROM), a high-speed clock, input/output (I/O) circuitry, and/or any other circuitry that may be required to perform the functions described herein.

The non-volatile memory 30 may include solid-state flash memory, or any other similar form of long-term, non-volatile memory that may be used to store program data and/or software application algorithms. The processor 20 may be digitally interconnected with the non-volatile memory 30, and may be configured to retrieve the program data and software application algorithms from the memory 30 and execute the algorithms in a manner that is known in the art.

The display device 32 may include a liquid crystal display (LCD), a light emitting diode display (LED), an organic light emitting diode display (OLED) and/or any similar style display/monitor that may exist or that may be hereafter developed. The display device 32 may receive a visual data stream 38 from the processor 20, and display it in a visual manner to a user.

Figure 3:
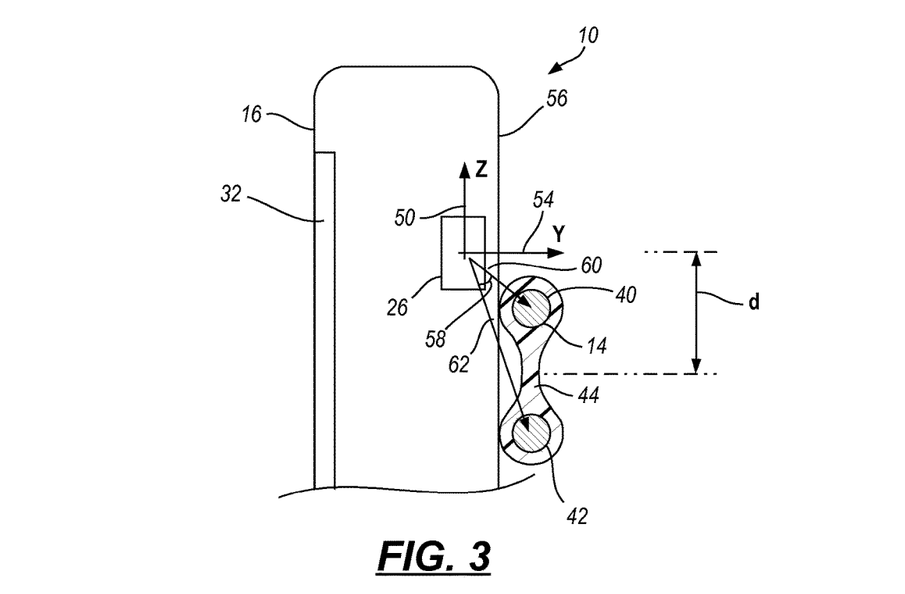
FIG. 3 is a schematic partial cross-sectional view of the portable digital computing device and wire of FIG. 1, taken along line 3-3

FIG. 3 illustrates a partial schematic cross-sectional view of the smart phone 16 and wire 14 of FIG. 1, taken along line 3-3. As shown, the AC electrical wire 14 has at least two electrical conductors 40, 42 (e.g., metallic wires) that are separated by one or more layers of electrical insulation 44 (e.g., a polymeric insulator). Due to the nature of AC electricity, at any given time, the electrical current in the first conductor 40 flows in an opposite direction from the electrical current in the second conductor 42 (i.e., $I_1=-I_2$), with a magnitude having a generally sinusoidal nature.

Under normal conditions, the magnetic field of a single conductor is represented in Equation 1, $$B = \frac{\mu_0 I}{2\pi r} \qquad \text{Equation 1}$$

where B is the magnetic field strength in Teslas; r is the radius from the center of the wire to a measuring point (generally ignoring the diameter of the wire); I is the current in amps; and $\mu_0$ is the permeability of free space (i.e., approximately $4\pi \times 10^{-7}$ T·m/A).

As mentioned above, the magnetometer 26 may be a 3-axis magnetometer, which is capable of measuring magnetic field strength in three distinct coordinate directions that are generally orthogonal to each other (i.e., the "sensing axes"). In one configuration, the sensing axes may generally be aligned with the geometric axes of the smart phone 16, where, the height of the phone 16 may define a Z-axis 50, the width of the phone 16 may define an X-axis 52, and the thickness of the phone 16 may define a Y-axis 54. (the X and Z axes 52, 50 are best illustrated in FIG. 1, while the Z and Y axes 50, 54 are best illustrated in FIG. 3).

If a current-carrying wire 14 is parallel to both the X-axis 52 and the back surface 56 of the smart phone 16, as shown in FIG. 3, the magnetic field components ($B_{y1}$, $B_{z1}$) at a sensing location ($y_1,z_1$) relative to the first conductor 40 can be expressed as a function of the current I flowing through the wire 14, as shown in Equation 2. Similarly, the magnetic field components ($B_{y2}$, $B_{z2}$) at a sensing location ($y_2,z_2$) relative to the second conductor 42 are represented in Equation 3

$$(B_{y_1}, B_{z_1}) = \left( \frac{z_1 \mu_0 I}{2\pi(y_1^2 + z_1^2)}, \frac{y_1 \mu_0 I}{2\pi(y_1^2 + z_1^2)} \right) \qquad \text{Equation 2}$$

-continued $$(B_{y_2}, B_{z_2}) = \left( \frac{-z_2 \mu_0 I}{2\pi(y_2^2 + z_2^2)}, \frac{-y_2 \mu_0 I}{2\pi(y_2^2 + z_2^2)} \right)$$ Equation 3

Equations 2 and 3 may be combined using vector addition to represent the combined magnetic field in a global space (i.e. ($B_y$, $B_z$)) that is coincident with the sensed field measured by the magnetometer 26. As evidenced by Equations 2 and 3, the position of the wire 14 with respect to the sensor/magnetometer 26 greatly affects the sensed magnetic field strength ($B_y$, $B_z$). While the wire position along the Y-axis 54 may be constrained by requiring the user to establish physical contact between the wire and the back surface 56 of the phone 16, the wire position along the Z-axis 50 may be highly variable.

Figure 4:
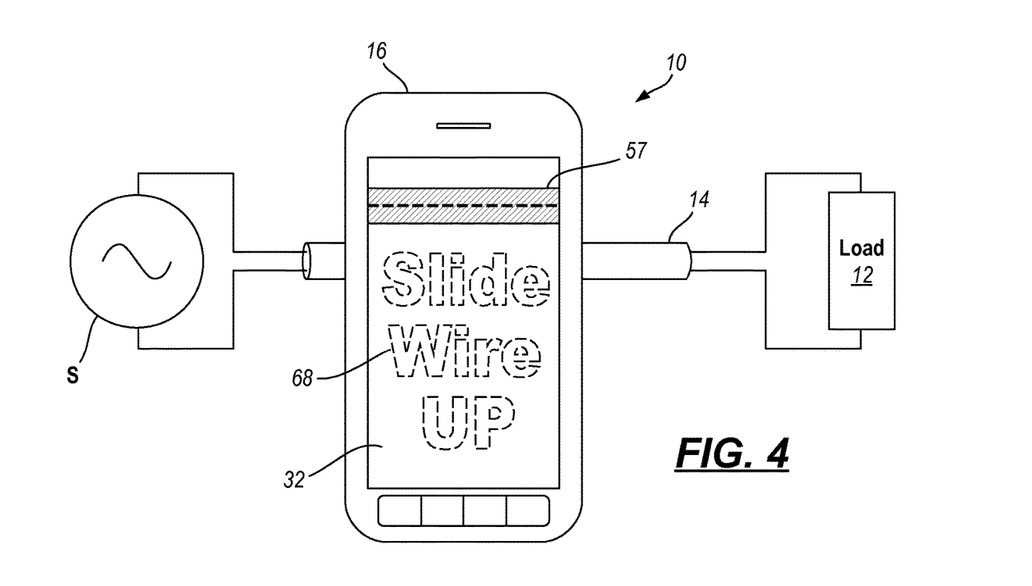
FIG. 4 is a schematic diagram of a smart phone providing an indication to aid in aligning an electrical wire with a magnetometer of the phone to enable accurate detection of one or more electrical parameters.

To aid the user in accurately and repeatably positioning the wire 14 along the Z-axis 50, in one embodiment, as shown in FIG. 4, the phone 16 may use the integrated display 32 to provide a visual alignment indicator 57, which may indicate proper wire placement to the user. By having a substantially constant wire position on the Z-axis 50, the processor 20 may be calibrated to provide a consistent and accurate estimate of electrical current/power in the wire 14.

While a visual alignment indicator 57 may be a good open-loop indicator of a required wire position, it has also been found that a Z-axis position 50 where the magnetic field strength is equal in the Y and Z axes 54, 50 provides the most reliable computations/electrical estimates. Additionally, when at this position of magnetic equality, estimation errors attributable to variations in the thickness of the wire and/or distances between the wires are minimized. Said another way, an ideal wire location along the Z-axis 50 exists where $|B_{y1}+B_{y2}|=|B_{z1}+B_{z2}|$ or where $|B_y|=|B_z|$ (in a global frame). As generally illustrated in FIG. 3, these relationships have been found to be satisfied at least where the angle 58 between the wire vectors 60, 62 is approximately 30 degrees. This angle 58 generally results in the wire being slightly offset (e.g., by a distance $|d|>0$) from the magnetometer 26 rather than being symmetrically disposed about it (e.g., d=0).

Figure 5:
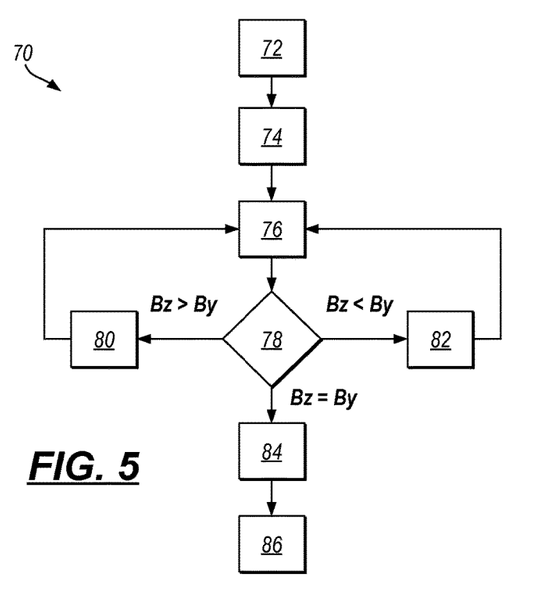
FIG. 5 is a schematic diagram of a method of prompting a user to position a wire relative to a smart phone to enable accurate estimation of one or more power parameters.

FIG. 5 generally illustrates a method 70 of prompting a user to position a wire 14 relative to a smart phone 16 to enable accurate estimation of one or more power parameters of the wire 14 and/or an associated load 12. The method 70 begins at step 72 when an energy monitoring application running on a smart phone 16 is initialized. Following the initialization, in step 74, the processor 20 may provide an indication to the user, via the display 32, to position the wire horizontally behind the phone 16 and firmly against the phone's back surface 56. This indication may, for example, include providing an image of a wire or another visual reference indicator 57 on the display 32 as a guide for approximate placement (such as shown in FIG. 4). In step 76, the processor 20 may poll the magnetometer 26 for a magnetic field strength indication in a direction that is both transverse to the wire and parallel to the phone (i.e., $B_z$ along the Z-axis 50), and in a direction that is transverse to both the wire and the phone (i.e., $B_y$ along the Y-axis 54). In step 78, the processor 20 may compare the relative magnitudes of $B_y$ and $B_z$. If $B_z$ is greater than $B_y$, in step 80, the processor 20 may provide an indication to the user (via the display 32) to slide the wire down (i.e., in a negative Z direction), conversely if $B_z$ is less than $B_y$, in step 82, the processor 20 may provide an indication 68 to the user (via the display 32) to slide the wire up (i.e., in a positive Z direction), such as shown in FIG. 4. Finally, if the wire 14 is positioned correctly such that the sensed magnitudes of $B_y$ and $B_z$ are equal, in step 84, the processor 20 may provide an indication to the user (via the display 32) to maintain the position, where it will then proceed to determine the one or more power parameters of the wire in step 86.

Using Equations 2 and 3, the current I flowing through the wire 14 at any instant may be determined as a function of the sensed magnetic field ($B_y$, $B_z$) by the magnetometer 26. Additionally, the voltage V of the wire may be known (as it is generally regulated via the power distribution systems). From the known voltage and sensed current, the processor 20 may determine total real power (measured in Watts (W)). Additionally, by analyzing the current I in the frequency domain, total harmonic distortion (THD) may be computed, as well as a power factor (PF), a total apparent power (S) (measured in volt-amperes (VA)), and a total reactive power (Q) (measured in reactive volt-amperes (var)).

To estimate the power factor, the processor 20 may need to derive the magnitude of at least the first and third harmonics of the AC electrical signal. For a 60 Hz AC signal (as is the case in the United States), the frequency of the first and third harmonics are respectively a 60 Hz, and 180 Hz. To avoid aliasing effects caused by the sampling frequency, the processor 20 needs to sample the wave at a rate that is greater than twice the fastest frequency (i.e., at the Nyquist rate). Therefore, to derive the magnitude of the third harmonic, the processor 20 would need to sample the magnetic field at a rate faster than 360 Hz. Where possible, it is advantageous for the system to sample at a rate that is greater than or equal to the Nyquist rate, though less than twice the Nyquist rate. Presently, however, the magnetometers found in most consumer electronics (including smart phones 16) are polled devices that sample at a rate only up to approximately 100 Hz. This rate is more than three times slower than the required 360 Hz, and even too slow to determine the magnitude of the first harmonic (which would require a minimum sampling rate of 120 Hz).

To solve this under-sampling problem, a circular sampling technique may be used to assemble a single detailed wave over a plurality of cycles. This technique may be possible in smart phones and other similar consumer electronics (as opposed to more sophisticated measuring devices) because the magnetometers in such consumer electronics generally lack anti-aliasing filters. More specifically, magnetometers in smart phones and other consumer electronics are generally intended to be used as a compass to measure an extremely stable magnetic field of the Earth. This field may only be perceived to change as a function of a physical yaw, pitch, or roll of the device, which is comparatively slow in view of the sampling frequency and/or speed of the processor. For this reason, these compass-style magnetometers generally do not require bandwidth limiting filters to prevent aliasing (as they are not required and perceived as added/unnecessary expense by the device manufacturers).

Figure 6:
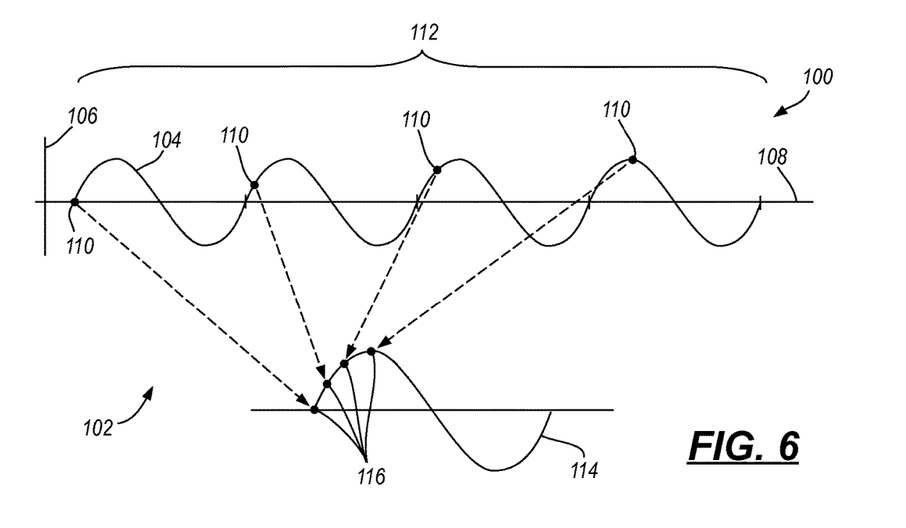
FIG. 6 is a schematic plot illustrating a circular sampling technique to accumulate a highly sampled electrical cycle from a plurality of actual electrical cycles.

FIG. 6 schematically illustrates a plot 100 of a circular sampling technique 102 as applied to an alternating magnetic field wave 104, where magnetic field strength 106 is plotted against time 108. In the presently used circular sampling technique 102, the processor 20 polls the magnetometer 26 to receive a field strength reading 110 at a rate slightly slower than the frequency of the wave 104. In this manner, the readings 110 may progressively advance through the wave 104 from cycle-to-cycle, across a plurality of cycles 112. If the samples 110 are assembled into a single consolidated wave 114, the consolidated readings 116 may collectively satisfy the Nyquist criteria, where the prior readings did not. For example, in one configuration, with a 60 Hz wave, the processor 20 may receive magnetic field strength readings 110 at a rate of approximately 50-59 Hz. In another configuration, the processor 20 may receive readings at a rate of approximately 53.24 Hz.

Figure 7:
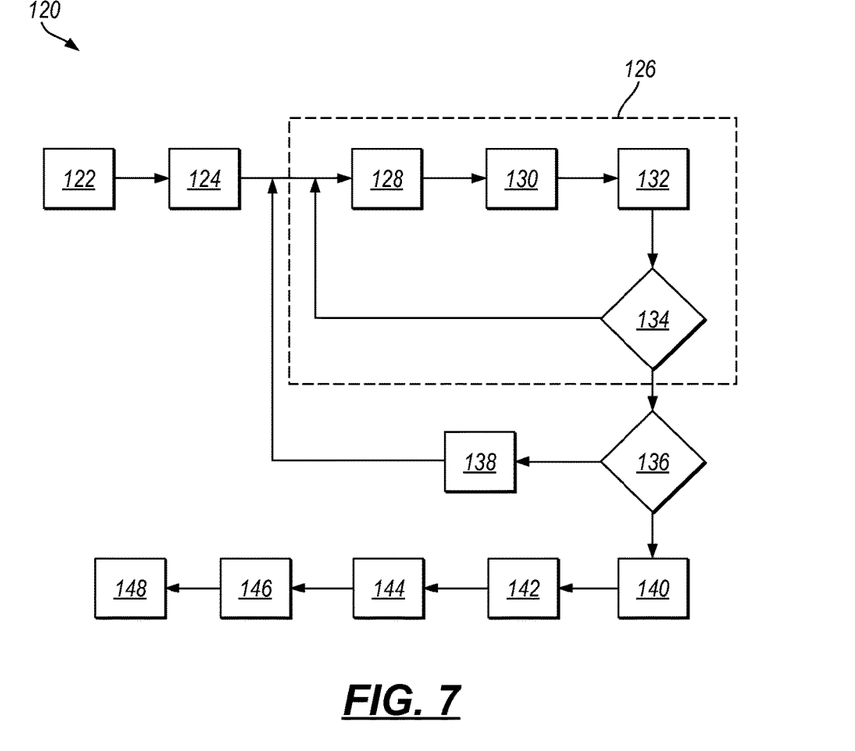
FIG. 7 is a schematic diagram of a method of determining and displaying an electrical parameter from the output of a magnetometer in a portable digital computing device.

A sampling method 120 is schematically illustrated in FIG. 7. Generally this method 120 may be performed after the wire 14 is accurately positioned, such as using the method 70 provided in FIG. 4. As shown, the processor 20 may begin sampling the ambient magnetic field strength at 122 by polling the magnetometer 26 at a predefined sampling frequency. In one configuration, the predefined sampling frequency may be slower than the expected frequency of the AC wave that the device is attempting to measure. In step 124, the processor 20 may attempt to maintain the sampling at the predefined sampling frequency using a phased-locked-loop (PLL) that is referenced to an internal oscillator of the smart phone 16.

In most existing smart phones, the internal oscillator has been found to be somewhat unreliable. From phone to phone, the oscillator frequencies may deviate by up to approximately 2 Hz. Likewise, within a single device, there may be random phase noise, along with phase discontinuities of up to $2\pi$ radians (a complete cycle) due to random restarting of the sampling process after a random number of samples. While the PLL may be very consistent over a short period of time, due to the unreliable oscillator, it may be periodically unreliable and/or highly variable/irregular from device to device, particularly when compared with the extremely constant line frequency.

Due to the variability between devices, and even the irregularities within a single device, it may be difficult or impossible to calibrate a particular sampling routine to be effective only using the PLL and requested sampling frequency. To more accurately assemble the consolidated wave 114, the processor 20 may be required to treat the samples as being irregularly taken, and employ an absolute reference consolidation method 126 to generate a single, consolidated cycle. In one configuration the consolidation method 126 may be similar to a 1-dimensional lucky imaging processing technique. This consolidation method 126 may use an absolute reference, such as time, to coordinate the various samples, rather than attempting to use a known unreliable reference, such as requested sampling frequency or period.

Certain embedded processors, such as RISC-based computer processors and/or CISC-based computer processors, such as those having an "ARM" architecture, are capable of providing accurate time stamps (e.g., within approximately 500 nS) to incoming signals. Regardless of the phase noise, actual sampling frequency, and/or phase discontinuities of the magnetometer 26, in step 128, the processor 20 may log the time each magnetic field strength reading arrives in such a manner. Using this accurate timestamp, together with an extremely reliable and known line frequency, in step 130, the processor 20 may locate/position each recorded sample within a single $2\pi$ radian phase that is represented by a circular buffer. The highly accurate time stamps may allow the processor 20 to determine the absolute phase of each sample to within $1.47 \times 10^{-4}$ radians, which may limit phase noise to less than 0.029% (i.e., a negligible effect). Once the phase is established, each sample may be stored in the sample buffer at an appropriate location given the size of the buffer.

Figure 8:
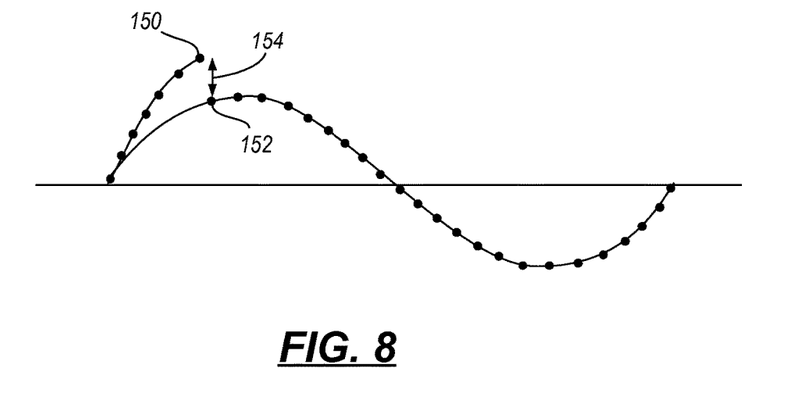
FIG. 8 is a schematic plot of a validation strategy for determining whether there has been a change in a characteristic of an electrical load, or a movement of a wire relative to the portable digital computing device being used to monitor the wire.

In one configuration, in step 132, a second integer-buffer may be maintained concurrently with the sample buffer to determine whether the processor 20 has completed an entire cycle of samples (i.e., the sample buffer has been completely filled). In step 134, if the integer buffer has not indicated that a complete cycle has been assembled, the processor 20 may continue sampling. If a complete sample has been acquired, however, then in step 136, the processor 20 may compare the last logged sample with the most adjacent forward sample (e.g., from a previous iteration through the sample buffer). As generally illustrated in FIG. 8, if the most recent sample 150 deviates from the adjacent forward sample 152 by more than a predetermined amount 154, then the processor may clear the sample buffer and begin assembling a new sample buffer in step 138. While FIG. 8 generally illustrates the samples being sequential, in practice, they may be interleaved. As such, in another configuration, the processor 20 may simply compare a recently acquired sample 150 to adjacent samples in the buffer.

The practical interpretation of step 136 is to determine if there has been either a change in the powerflow through the wire, or a physical movement of the wire during the sampling period. In most appliances, over a several second period, the electrical characteristics of the appliance are generally stable. Therefore, a drastic discontinuity within the circular buffer between samples (e.g., greater than 10% of the maximum energy range) may suggest that either the load 12 has changed state (e.g. on to off), or an outside influence is affecting the sensed magnetic field (e.g., a proximate magnet, or movement of the wire). By clearing the sample buffer and restarting, the processor 20 is making the assumption that the transient power condition or outside influence has stabilized. If two errors occur in a sequential manner, then the processor 20 may display a "detection failed" message to the user and/or continue restarting until successful.

In the above described method, the absolute-reference consolidation method 126 may establish a sample buffer that may be subdivided into a plurality of bins, with magnetic field strength samples being irregularly placed into the bins according to their respective timestamps. In one configuration, the sample buffer may include 192 discrete bins. In this manner, following the creation and validation of the sample buffer, in step 140, the buffer may be smoothed by averaging groups of three adjacent samples to result in a 64 sample waveform. The smoothing reduces artifacts or noise that may be attributable to sensor interference, and/or random error in the magnetometer 26.

Following the smoothing in step 140, the 64 bin smoothed waveform may be passed to a 64 sample Fast Fourier Transform (FFT) to determine the magnitude of the sensed magnetic field in the frequency domain (step 142). As may be appreciated the use of a 192 bin sample buffer and a 64 bin are provided merely as possible examples of buffer size to illustrate the above mentioned technique. Other buffer sizes may similarly be used without departing from the scope of the present disclosure.

While the 64 sample buffer may be less sparse than the original 192 sample buffer, it still may contain discontinuities due to irregular sampling, or an insufficient amount of time to complete a full consolidated waveform. In one configuration, the discontinuities can be theorized as the original waveform, multiplied by a gating waveform. Since the waveform will be converted into a spectral representation by the Fourier transform, the gating waveform (i.e., the discontinuities) may generally have two effects. First, it/they may spread the higher frequency bands of the spectrum. These frequencies, however, may simply be ignored, as only low frequency bands (e.g., first and third) are necessary to estimate the power factor and/or other commonly requested usage-based parameters.

As a second effect, the discontinuities may serve to generally lower the amplitudes of all frequency bins. In step 144, however, this general decrease may be compensated by scaling the waveform up using the ratio of the buffer size to the actual number of samples successfully accumulated. For example, if the waveform has discontinuities in 3 of the 64 bins (i.e., magnetic field strength measurements only exist in 61 of the 64 bins), a scaling factor of 64/61 may be applied to the FFT output to correct the waveform amplitude.

Once the power at each harmonic is scaled to compensate for the energy loss from missing samples, the fundamental (i.e. the first) and third harmonic amplitudes (i.e., $M_1$ and $M_3$) may be used to estimate the power factor (i.e., the phase difference between the current and the voltage of the device) in step 146.

In general, purely resistive loads have no harmonic content, so when the ratio of $M_3/M_1$ is approximately equal to zero, the estimated power factor may be set to unity (1.0). Inductive loads are known to have some harmonic content, for example, due to magnetic core saturation. Therefore, when the ratio of $M_3/M_1$ is between approximately 0.1 and 0.5, the power factor (PF) may be set according to Equation 4.

$$PF = \frac{1}{1 + \frac{M_3}{M_1}} \qquad \text{Equation 4}$$

Finally, in switching power supplies, such as in computers, televisions, and compact fluorescent bulbs, the AC wave is typically rectified and used to charge capacitors. This behavior causes the current signal to characteristically lead the voltage signal by a particular phase angle. When the processor 20 detects such a phase difference between $M_1$ and $M_3$, it may use Equation 5 to determine the complex magnitude and solve for the power factor (PF)

$$PF = \frac{1}{\sqrt{M_1^2 + M_3^2}} \qquad \text{Equation 5}$$

Once the current, power factor, and various measures of real and apparent power are determined, the processor 20 may display the determined parameters to the user via the display 32 in step 148.

In another embodiment, the above-mentioned technique of sensing the magnetic field via the smart phone magnetometer 26 may be used to properly estimate and characterize the current flow through the wire. At the same time, an electrical field of the wire 14 may be sensed in a similar manner using audio circuitry of the device. Said another way, when a phone 16 is close enough to a wire 14 to measure the magnetic field 28 with the magnetometer 26, the wire's electrical field induces interference in the phone's audio input circuitry. The electrical field is known to be proportional to the voltage signal of the wire, just like the magnetic field is proportional to the current signal.

Therefore, by quantifying the current signal (using the sensed magnetic field) and the voltage signal (using the sensed electrical field), the power factor may be determined by directly measuring the phase difference between the two signals. This computation may be used to increase the accuracy of the power factor estimations derived from the harmonic signals, or may be used as a substitute for these estimations.

As an additional capability, the smart phone 16 may utilize the wireless radio to upload the derived energy parameters to a central database, where they may be shared in social-media style with other users to establish a centralized database of typical power consumption for specific makes/models of home appliances.

While the best modes for carrying out the invention have been described in detail, those familiar with the art to which this invention relates will recognize various alternative designs and embodiments for practicing the invention within the scope of the appended claims. It is intended that all matter contained in the above description or shown in the accompanying drawings shall be interpreted as illustrative only and not as limiting.

The invention claimed is:

1. A method of analyzing an alternating electrical current having a constant fundamental frequency and generating a magnetic field, the method comprising:
    positioning a multi-conductor electrical wire in contact with a cellular telephone, wherein the electrical current is flowing through the multi-conductor electrical wire;
    polling a magnetometer disposed within the cellular telephone at a constant sampling frequency to generate a plurality of magnetic field strength readings, wherein the polling occurs over a plurality of cycles of the alternating electrical current;
    assigning a time stamp to each of the plurality of magnetic field strength readings;
    saving each of the plurality of magnetic field strength readings within a common circular buffer according to its respective time stamp and the fundamental frequency of the electrical current;
    determining one or more harmonics of the magnetic field by analyzing the common circular buffer using a Fourier transform.

2. The method of claim 1, wherein the sampling frequency is slower than the fundamental frequency.

3. The method of claim 1, wherein the sampling frequency is between 50 Hz and 59 Hz.

4. The method of claim 1, wherein the sampling frequency is slower than a Nyquist frequency.

5. The method of claim 1, further comprising smoothing the circular buffer by averaging groups of three adjacent magnetic field strength readings prior to determining the one or more harmonics of the magnetic field.

6. The method of claim 1, wherein determining one or more harmonics of the magnetic field includes determining a magnitude of at least a first harmonic and a third harmonic of the magnetic field; and
    further comprising determining a power factor of the electrical current using the magnitude of a first harmonic and a magnitude of a third harmonic.

7. The method of claim 1, wherein determining one or more harmonics of the magnetic field includes determining a magnitude of at least a first harmonic; and
    further comprising determining at least one of total real power, total apparent power, and total reactive power using the magnitude of the first harmonic and a known line voltage.

8. The method of claim 1, further comprising maintaining an integer buffer concurrently with the circular buffer; and
    determining the one or more harmonics of the magnetic field when the integer buffer exceeds a threshold value.

9. The method of claim 1, wherein polling a magnetometer at a constant sampling frequency includes sampling using a phased-locked-loop that is referenced to an oscillator.

10. The method of claim 1, wherein the sampling frequency is greater than or equal to a Nyquist frequency, and less than twice a Nyquist frequency.

* * * * *